United States Patent [19]
Avanzino et al.

[11] Patent Number: 5,795,823
[45] Date of Patent: Aug. 18, 1998

[54] SELF ALIGNED VIA DUAL DAMASCENE

[75] Inventors: Steven Avanzino, Cupertino; Subhash Gupta, San Jose; Rich Klein, Mountain View; Scott D. Luning, Menlo Park; Ming-Ren Lin, Cupertino, all of Calif.

[73] Assignee: Advanced Micro Devices, Inc., Sunnyvale, Calif.

[21] Appl. No.: 752,807

[22] Filed: Nov. 20, 1996

Related U.S. Application Data

[62] Division of Ser. No. 478,319, Jun. 7, 1995, Pat. No. 5,614,765.
[51] Int. Cl.⁶ .................................................. H01L 21/441
[52] U.S. Cl. .................. 438/639; 438/696; 438/701; 438/713
[58] Field of Search ................................ 438/639, 696, 438/701, 713

[56] References Cited

U.S. PATENT DOCUMENTS

| | | | |
|---|---|---|---|
| 5,093,279 | 3/1992 | Andreshak et al. | 437/173 |
| 5,262,354 | 11/1993 | Cote et al. | 437/195 |
| 5,371,047 | 12/1994 | Greco et al. | 437/238 |
| 5,442,236 | 8/1995 | Fukazawa . | |
| 5,444,021 | 8/1995 | Chung et al. . | |
| 5,635,423 | 6/1997 | Huang et al. . | |
| 5,658,830 | 8/1997 | Jeng . | |

FOREIGN PATENT DOCUMENTS

| | | | |
|---|---|---|---|
| 4324638 | 2/1994 | Germany | H01L 21/283 |

*Primary Examiner*—Caridad Everhart
*Attorney, Agent, or Firm*—Foley & Lardner

[57] ABSTRACT

A method of fabricating an interconnection level of conductive lines and connecting vias separated by insulation for integrated circuits and substrate carriers for semiconductor devices using dual damascene with only one mask pattern for the formation of both the conductive lines and vias. The mask pattern of conductive lines contains laterally enlarged areas where the via openings are to be formed in the insulating material. After the conductive line openings with laterally enlarged areas are created, the openings are filled with a conformal material whose etch selectivity is substantially less than the etch selectivity of the insulating material to the enchant for etching the insulating material and whose etch selectivity is substantially greater than the insulating material to its enchant. The conformal material is anisotropically etched to form sidewalls in the enlarged area and remove the material between the sidewalls but leave material remaining in the parts of the conductive lines openings. The sidewalls serve as self aligned mask for etching via openings. The conformal material is either a conductive material which is left in place after the via openings are formed or an insulating material which is removed. In the former, the partially filled conductive line openings are filled with additional conductive material along with the via, which is either the same or different conductive material. In the latter, the conductive line openings and vias are filled with the same conductive material.

20 Claims, 4 Drawing Sheets

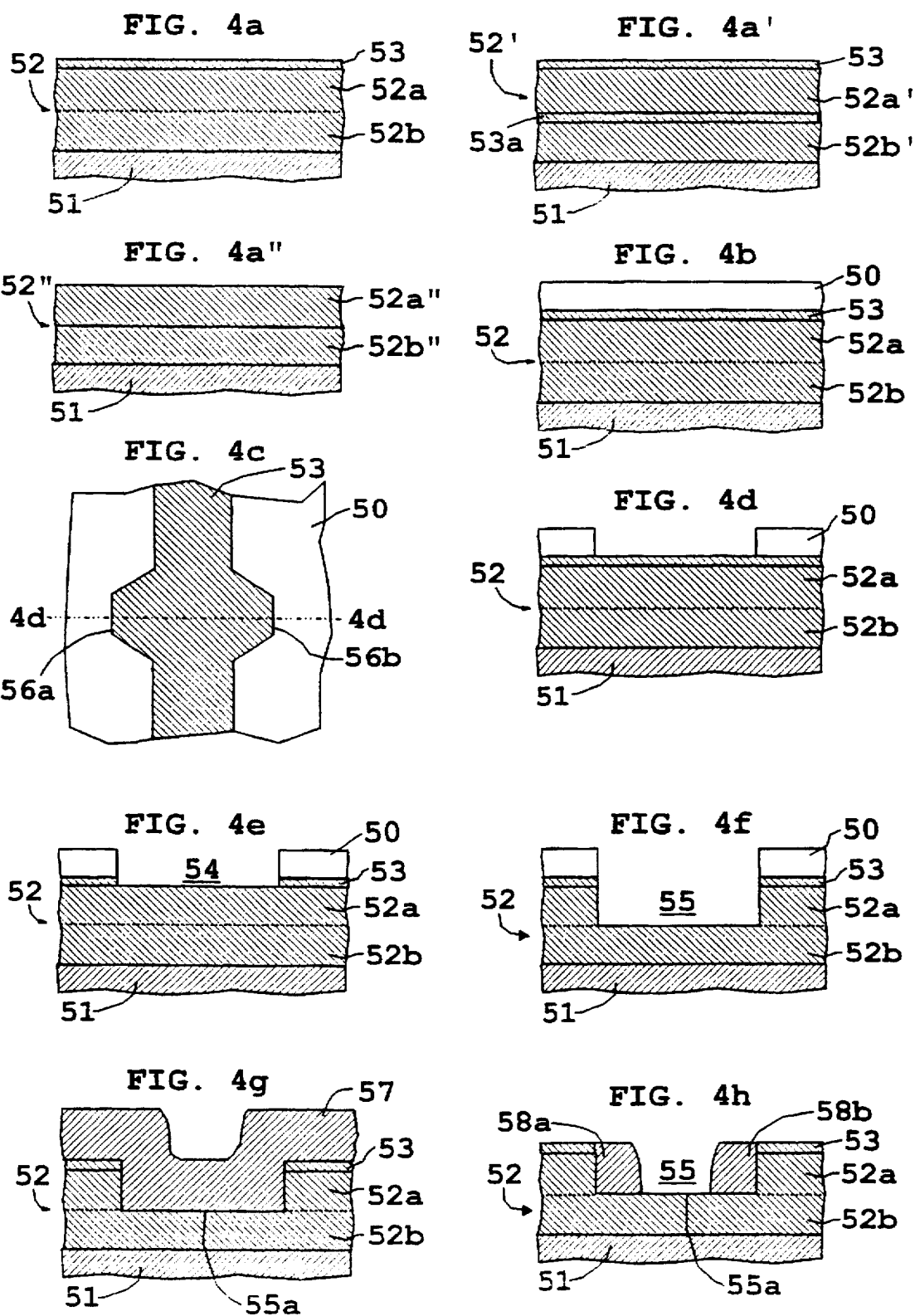

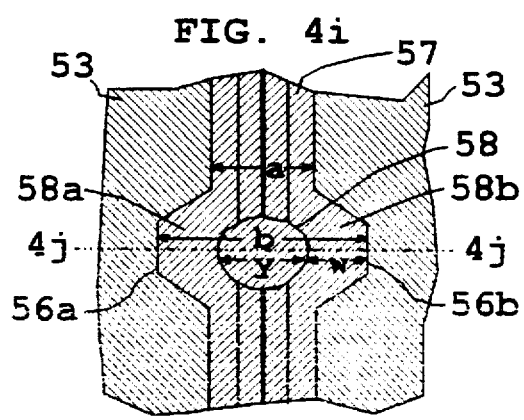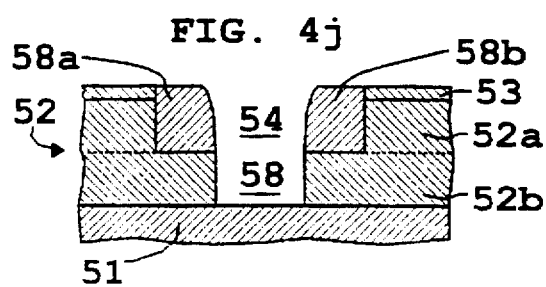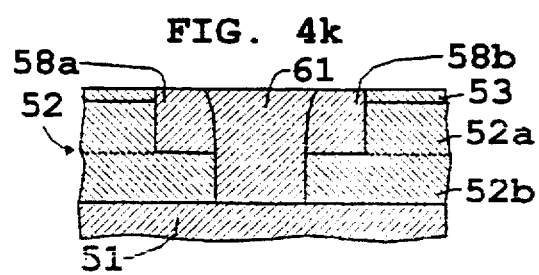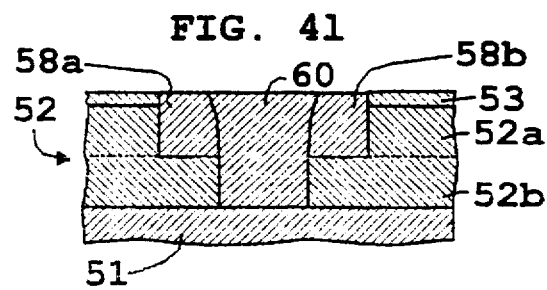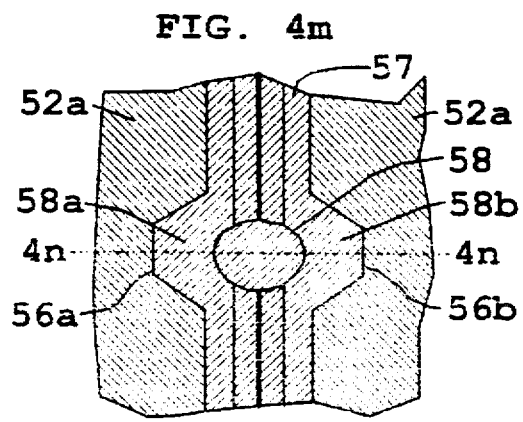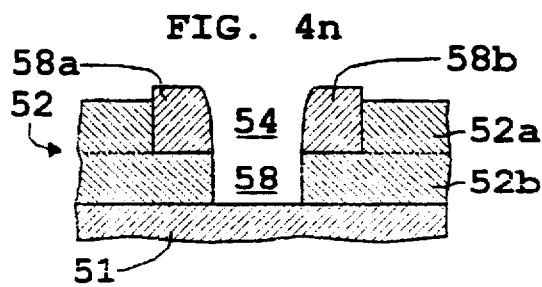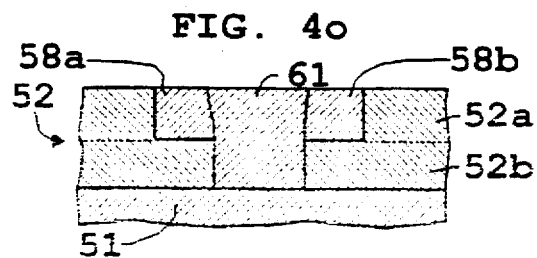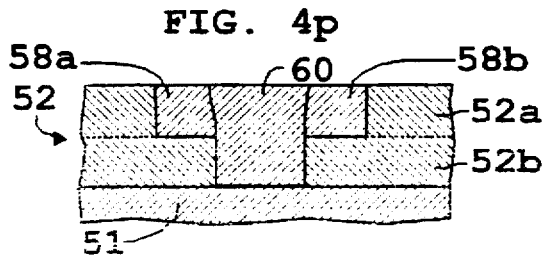

5,795,823

1

SELF ALIGNED VIA DUAL DAMASCENE

CROSS REFERENCES TO RELATED APPLICATIONS

This is a division of U.S. patent application Ser. No. 08/478,319 filed Jun. 7, 1995 now U.S. Pat. No. 5,614,765.

This application is related to U.S. patent application Ser. No. 08/478,321, entitled Subtractive Dual Damascene, filed on an even date herewith; U.S. patent application Ser. No. 08/478,324, entitled Dual Damascene With a Protective Mask for Via Etching, also filed on an even date herewith; and patent application Ser. No. 08/486,777, entitled Dual Damascene Within a Sacrificial Via Fill, also filed on an even date herewith.

BACKGROUND OF THE INVENTION

The present invention generally relates to the fabrication of metal conductive lines and vias that provide the interconnection of integrated circuits in semiconductor devices and/or the interconnections in a multilayer substrate on which semiconductor device(s) are mounted and, more particularly, to the fabrication of conductive lines and vias by a process known as damascene.

In fabricating very and ultra large scale integration (VLSI and ULSI) circuits with the dual damascene process, an insulating or dielectric material, such as silicon oxide, of a semiconductor device is patterned with several thousand openings for the conductive lines and vias which are filled at the same time with metal, such as aluminum, and serve to interconnect the active and/or passive elements of the integrated circuit. The dual damascene process also is used for forming the multilevel conductive lines of metal, such as copper, in the insulating layers, such as polyimide, of multi-layer substrates on which semiconductor devices are mounted.

Damascene is an interconnection fabrication process in which grooves are formed in an insulating layer and filled with metal to form the conductive lines. Dual damascene is a multi-level interconnection process in which, in addition to forming the grooves of single damascene, conductive via openings also are formed. In the standard dual damascene process, the insulating layer is coated with a photoresist which is exposed through a first mask with image pattern of the via openings and the pattern is anisotropically etched in the upper half of the insulating layer. The photoresist now is exposed through a second mask with an image pattern of the conductive line openings, after being aligned with the first mask pattern to encompass the via openings. In anisotropically etching the openings for the conductive lines in the upper half of the insulating material, the via openings already present in the upper half are simultaneously etched and replicated in the lower half of the insulating material. After the etching is complete, both the vias and line openings are filled with metal. Dual damascene is an improvement over single damascene because it permits the filling of both the conductive grooves and vias with metal at the same time, thereby eliminating process steps. Although this standard damascene offers advantages over other processes for forming interconnections, it has a number of disadvantages, such as it requires two masking steps to form the pattern, first for the vias and subsequently for the conductive lines. Further, the edges of the via openings in the lower half of the insulating layer, after the second etching, are poorly defined because of the two etchings. In addition, since alignment of the two masks is critical in order for the pattern for the conductive lines to be over the pattern of the vias, a relatively large tolerance is provided and the via does not extend the full width of the conductive line. Thus, improvements are needed in the standard damascene process to make the edges of the via opening better defined and eliminate the critical alignment of the masks.

SUMMARY OF THE INVENTION

The primary object of the present invention is to provide an improved dual damascene process for forming both the conductive lines and conductive vias with only a single pattern exposure step for the openings for both the lines and the vias, thereby eliminating the critical alignment of two masks.

Another object of the present invention is to provide an novel dual damascene process and structure in which the via openings are self-aligned to the conductive lines without using a lithographic mask.

A still further object of the present invention is to provide a dual damascene method and structure which permits the use of a second, more electromigration resistant metal in the via openings, thereby improving the electromigration property of the interconnections.

In accordance with dual damascene method and resulting structure of the present invention, a pattern for conductive line contains at least one slightly enlarged area in the pattern which identifies a region for a conductive via. After this pattern is etched partially through the insulating layer, a conformal material, which is etch resistant or has etch selectivity different from the insulating layer, is deposited in the etched openings and on the surface of the insulating layer. The conformed material is of a predetermined thickness to essentially fill the conductive line opening but only cover the walls and bottom of the insulating layer in the enlarged region. Using anisotropic or unidirectional etching, the deposited material is etched and removed from the surface of the insulating layer and from the bottom of and between the walls of deposited material in the enlarged region. The deposited material is left in the conductive line openings and, in the enlarged region, it covers the walls as sidewall spacers. Again using anisotropic etching, the insulating layer is etched with an etchant to which the deposited material is resistant to form via openings in the lower half of the insulating layer as outlined by the sidewalls and the deposited material at opposite ends of the sidewalls in the enlarged region. Subsequently, the line opening and via opening are completely filled with metal to form a conductive line and via in the insulating layer.

If the insulating layer is composed of a common material, a thin etch barrier is applied to the upper surface of the insulating layer to serve as an etch barrier during the etching of the via opening in the lower part of the insulating layer. Preferably, another etch barrier is disposed in the middle of the common-insulating material layer to serve as an etch stop during the etching of conductive line openings. Alternatively, if the insulating layer is two layers with different etch properties so that there is sufficient etch selectivity between them, then neither the top etch barrier nor the middle etch barrier are required. Instead, the etchant to which the lower insulating layer is resistant is used for etching the upper insulating layer, whose surface is protected by the resist mask, and the lower insulating layer serves as an etch stop in etching the upper insulating layer. The deposited material for the conformal layer may be either a conducting material or, according to another aspect of the invention, an insulating material. If an insulating material is used as the conformal layer, it is removed from the conductive line openings after the via opening is formed and the sidewall spacers are removed at the same time. If a conductive material is used to form the sidewall spacers in the enlarged area, the deposited material is not removed and the via openings are filled with the same metal as the deposited material. In an alternative embodiment, a different metal, such as one with improved electromigration resistance properties over the conformal metal, is used to fill the via openings and thereby enhance the electromigration resistance of the interconnections.

This single pattern, self aligned dual damascene method yields a novel interconnection structure of the present invention comprising an insulating layer having an upper and lower portion or different upper and lower layers. A conductive line is disposed in the upper portion or layer and a conductive via is disposed in the lower portion or layer. The conductive line comprises at least one section having a pair of substantially parallel walls ending at an enlarged region with at least one of the conductive walls extending laterally in the form of lateral recesses in the upper portion. The combined width of the two recesses, each of which is filled with a sidewall, is preferably about equal to the width of the conductive line and these sidewalls serve as an etch mask in etching the via opening. In one aspect of the present invention, each of the recesses or laterally extending regions in the upper portion of the insulating layer contain sidewalls of a conductive material which remains after etching the via opening.

BRIEF DESCRIPTION OF THE DRAWINGS

The foregoing and other objects, aspects and advantages will be better understood from the following detailed description of the preferred and other embodiments of the present invention with reference to the drawings, in which:

FIG. 1b (Prior Art) is a cross-sectional view of the patterned resist and etched insulating layers of FIG. 1a taken across 1b—1b of FIG. 1a.

FIG. 2b (Prior Art) is a cross-sectional view of the patterned resist and etched insulating layers of FIG. 2a taken across 2b—2b of FIG. 2a.

FIG. 3b is a cross-sectional view of the etched insulating layer of FIG. 3a taken across 3b—3b of FIG. 3a.

FIGS. 4a, 4a' and 4a" are three different starting insulating layers usable in the present invention.

FIGS. 4b, 4e, 4f, 4g, and 4h are sequential cross-sectional views of the steps used to fabricate dual damascene metallization in an insulating layer with the single pattern of the present invention.

FIG. 4c is a plan view of one of the sequential steps of the dual damascene of the present invention showing the single pattern of the present invention.

FIG. 4d is a cross-sectional view of the insulating layer taken across 4c—4c of FIG. 4c.

FIG. 4i is a plan view of one of the sequential steps of the dual damascene of the present invention showing metal spacers and an etched via opening.

FIG. 4j is a cross-sectional view of the insulating layer taken across 4i—4i and FIG. 4i.

FIG. 4k is a cross-sectional view of the etched opening in FIG. 4j filled with a metal different from the metal spacers.

FIG. 4l is a cross-sectional view of the etched opening in FIG. 4j filled with the same metal as the metal spacers.

FIG. 4m is a plan view of one of the sequential steps of the dual damascene of the present invention showing a barrier removed before metal deposition.

FIG. 4n is a cross-sectional view of the insulating layer taken across 4n—4n of FIG. 4m.

FIG. 4o is a cross-sectional view of the etched opening in FIG. 4m filled with a metal different from the metal spacers.

FIG. 4p is a cross-sectional view of the etched opening in FIG. 4m filled with the same metal as the metal spacers.

DETAILED DESCRIPTION OF THE PREFERRED EMBODIMENTS OF THE INVENTION

Figure 1A:
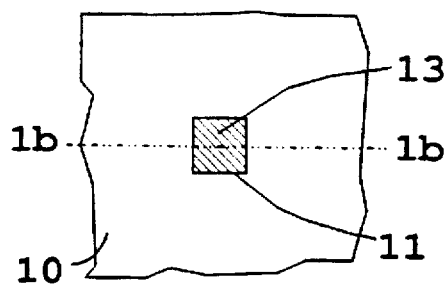
FIG. 1a (Prior Art) is a plan view of a portion of an exposed and developed via resist pattern on an etched insulating layer used in the standard dual damascene process.
Figure 1B:
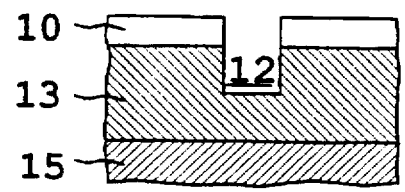
Figure 2A:
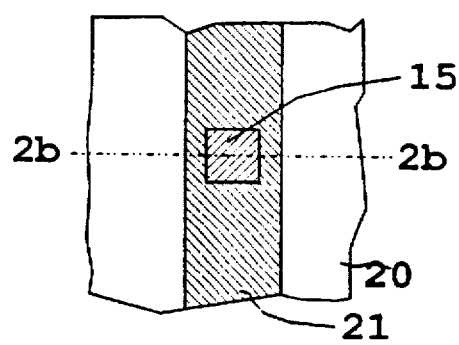
FIG. 2a (Prior Art) is a plan view of a portion of an exposed and developed conductive line resist pattern on the etched insulating layer used in the standard dual damascene process.
Figure 2B:
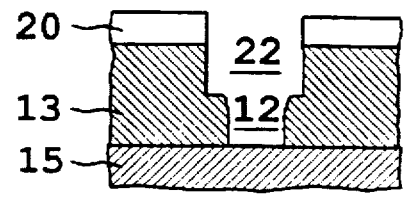
Figure 2C:
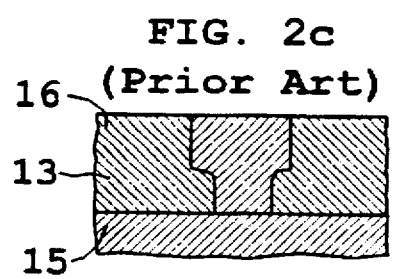
FIG. 2c (Prior Art) is a cross-sectional view of the insulating layer of FIG. 2b filled with metal.

Referring now to the drawings and, more particularly, to FIGS. 1a and 1b and FIGS. 2a, 2b and 2c, there is illustrated the standard method for forming dual damascene openings for conductive lines and vias. FIG. 1a shows a portion of a positive resist 10 with one pattern opening 11 which is used to define the via opening in an insulating layer for etching a via opening 12 in an insulating layer 13. As shown in FIG. 1b, the via opening 12 is etched in the upper portion of the insulating layer corresponding to pattern opening 11. The insulating layer 13 is disposed on a completed metallized insulation layer (not shown) containing a conductive line 15 to be physically contacted and electrically connected to an upper conductive line through a conductive via or an element of a device in a semiconductor substrate (not shown), when formed. After the via opening 12 is formed, a resist layer 20 containing a conductive line pattern 21, as shown in FIG. 2a, is aligned with the via opening 12. The conductive pattern 21, which is wider than the via opening 12, is anisotropically etched in the upper portion of the insulating layer to form the conductive line opening 22 in the upper portion. Simultaneously with this etching, the via opening 12, which is exposed to the same etchant gas(es), is etched and replicated in the lower portion of insulating layer 13, as shown in FIG. 2a, to the underlying conductive line 15 which serves as an etch stop. Next, the openings 12 and 22 for the conductive line and conductive via, respectively, are filled with metal 16 to make physical contact with and electrical connection to the conductive line 15.

Although the standard dual damascene method provides advantages over other metallization methods, it requires two masking steps which must be aligned with a high degree of accuracy in VLSI semiconductor device fabrication and with even a greater degree accuracy in ULSI device fabrication. If misalignment occurs, there can be opens created due to electromigration in the interconnections of the conductive lines and vias. In addition, the two etching steps of vias cause the corners of the vias to become extremely ragged because they are not protected during the second etch.

Figure 3A:
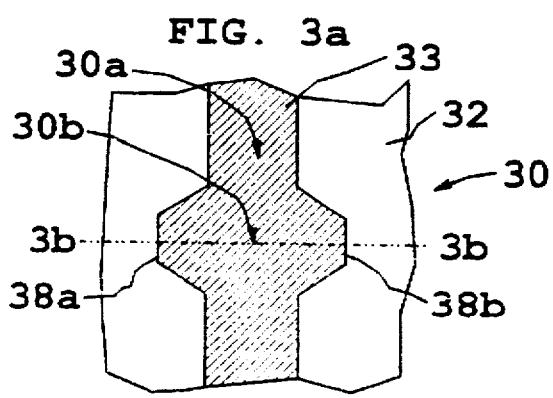
FIG. 3a is a plan view of a portion of an exposed and developed via and conductive lines resist pattern on an etched insulating layer of the present invention.
Figure 3B:
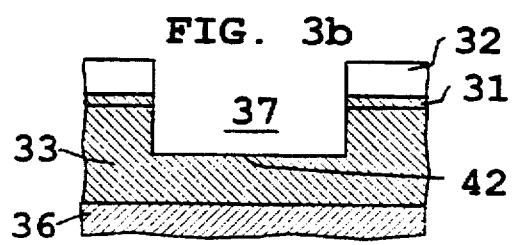
Figure 3C:
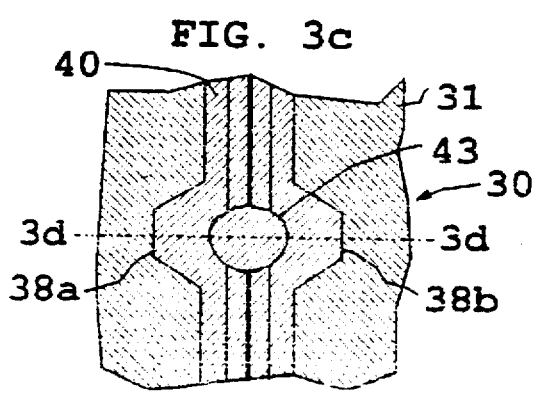
FIG. 3c is a plan view of the metal filled insulating layer of the present invention.
Figure 3D:
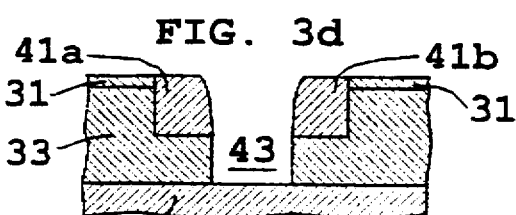
FIG. 3d is a cross-sectional view of the insulating layer taken across 3c—3c of FIG. 3b after spacer formation and via etching.
Figure 3E:
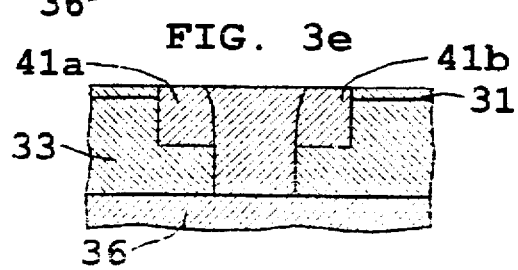
FIG. 3e is a cross-sectional view of the insulating layer filled with metal.

These disadvantages are overcome by the method of the present invention as generally shown in FIGS. 3a, 3b, 3c, 3d and 3e. A portion of the novel pattern 30 of the invention is illustrated in FIG. 3a showing a conductive line portion 30a with a via portion 30b as part of the conductive line pattern and laterally enlarged beyond the width of the conductive line portion. Turning now to the cross-section of FIG. 3b, a thin etch barrier layer 31 is disposed under a resist layer 32 and on an insulating layer 33 carried on a completed metallized layer (not completely shown) with a conductive line 36. The layer of positive resist 32 coated on the etch barrier 34 defines the pattern 30 for the conductive line pattern 30a and the via pattern 30b and serves as an etch mask for etching the pattern in the etch barrier 31 and the insulating layer 33. The mask pattern is etched completely through the etch barrier layer 34 and is timed to etch the upper portion of the insulating layer 33. After etching, a conductive line opening 37 is formed with lateral enlarged openings 38a and 38b on each side of the line opening 37, corresponding in shape to the pattern 30 of FIG. 3a. The opening in etch barrier layer 31 in the areas covered with resist is created by etching to expose the surface of the insulating layer 33 which is then anisotropically etched with a suitable plasma gas to etch partially through the insulating layer 33. Next, after removing the resist layer 32, a conformal conductive or insulating material 40 (FIG. 3c) is deposited on the surface of the insulating layer and in the openings 37, 38a and 38b to a sufficient thickness so that the bottom and walls of the conductive line openings will still be covered with the conformal material after a subsequent anisotropic etching step. To achieve this requirement, the thickness of the conformed material is preferably about one half of the width of the conductive line opening. After deposition, the conformal material is anisotropically etched to the surface 39 of the barrier 31 and the surface 42 of the previously etched conductive line opening 37 to leave the opening at least partially filled with the conformal material 40 as shown in FIG. 3c and to form sidewall spacers 41a and 41b in the enlarged openings 38a and 38b, respectively. The conformal material on the bottom of the conductive line opening between the enlarged openings 38c and 38b is removed during etching, leaving the upper surface 42 (FIG. 3b) of the lower portion of the insulating layer 33 exposed. This exposed surface is anisotropically etched with a suitable etchant to which the deposited conformal material 40 and the etch barrier 31 are resistant, or its etch selectivity differential is sufficiently low so that only minimal etching of the conformal material occurs during the time the lower portion of the insulating layer 33 is etched. Thus, the only etching occurs between and along the length of the sidewall spacers 41a and 41b to the underlying conductive line 36, thereby forming a via opening 43 in the lower portion of the insulating layer 33 as shown in FIGS. 3c and 3d. The conductive line and via openings are now filled with metal as shown in FIG. 3e.

With this general description as background, reference will now be made to one preferred embodiment as shown by the sequence of steps in FIGS. 4a through 4h. FIGS. 4a, 4a' and 4a" show three alternative starting insulating layers 52 in performing the method of the present invention. In FIG. 4a, the preferred starting insulating layer 52 comprises a common insulating material, herein silicon dioxide ($SiO_2$) of about 1.6 to 2.0 microns (μ) coated with a etch barrier layer 53 of about a 1000 Å which herein is titanium nitride (TiN). The layer 53 is resistant to or has low selectivity to the plasma gases which are used to etch openings in the insulating layer. To provide an etch stop for etching, herein, half way through the insulating layer, the layer 52' of FIG. 4a' includes both the etch barrier 53 on top of the insulating layer upper portion 52a' and an middle etch barrier 53a which precisely stops the etching of the conductive line pattern half way through the insulating layer. This etch stop barrier 53a can be the same material as the barrier layer 53 since it needs to be resistant to the etching gases used to etch the insulating layer portion 53a'. As an alternative solution to the middle etch barrier, the insulating layer can be a composite of two layers 52a" and 52b" of different materials having etch properties such that the plasma gases used to etch the top layer 52a" will not etch the bottom layer 52b". In this alternative insulating composite layer 52", the layer 52b" preferably is siliconoxynitride (SiOxNy) when the layer 52a" is $SiO_2$. Of course, these materials can be reversed with the $SiO_2$ being layer 52b".

Using the insulating layer 52 of herein $SiO_2$ of FIG. 4a, with the etch barrier 53 and carried on an insulating layer (not shown) with an underlying conductive line 51, a layer of commercial positive resist 50 is applied to the surface of the barrier layer 53 of silicon nitride ($Si_3N_4$ or SiN) or TiN, herein TiN as shown in FIG. 4b, and exposed to the pattern of FIG. 4c and developed. The layer 53 is sputter etched in a conventional sputter etch system with noble gas ions, such as argon (A), performing the etching to create an opening 54, as shown in FIG. 4e. Next, a parallel plate reactive ion etch (RIE) apparatus or, alternatively, an electron cyclotron resonance (ECR) plasma reactor is used to anisotropically etch the insulating layer portion 52a, as shown in FIG. 4f, with a plasma gas herein comprising carbon tetrafluoride ($CF_4$) and at least 40% hydrogen ($H_2$), with the resist 50 serving as an etch barrier for the etching layer 52. The etching of insulating layer portion 52a continues for a time sufficient to etch the $SiO_2$ through the portion 52a or half way into the layer 52 to form the conductive line opening 55 with an enlarged region having lateral openings 56a and 56b at the point for the via opening as shown in FIG. 4f. The width of the enlarged openings 56a and 56b is determined by the desired width of the via opening. As best shown in FIG. 4i, the width of each opening 56a and 56b can be determined by the following equation:

$$W = \frac{b-y}{2}$$

where W is the width of each opening 56a and 56b; b is the width of the conductive line opening 55; and y is the predetermined desired opening of the via.

After removal of the resist layer by ashing, a conformal material 57, herein aluminum (Al) doped with about 1% copper (Cu) (Al/1%Cu), is sputtered, using commercially available equipment, on the surface of the insulating layer 52 to a thickness to fill the conductive line openings and coat the walls of the enlarged openings 56a and 56b and the bottom surface 55a of the conductive line opening 55 between the enlarged openings as shown in FIG. 4g. The conformal coating 57 of herein Al/1%Cu has a etch selectivity different from the insulating layer 52 of herein SiO₂ so that the insulating layer is substantially etch resistant to the etchant and serves as an etch stop at the bottom surface 55a. Using anisotropic etching with one of above-mentioned reactors and. an etchant gas of boron trichloride (BCl₃) and chlorine (Cl₂) for Al/1%Cu but with low selectivity for SiO₂. the conformal coating 57 is etched to form. as shown in FIG. 4h. sidewall spacers 58a and 58b in the enlarged openings 56a and 56b, respectively. The etching also removes the conformal material 57 on the bottom surface 55a between the sidewall spacers as shown in FIG. 4h, with the lower half of the SiO₂ layer 52b functioning as an etch stop. In accordance with the present invention, these sidewall spacers 58a and 58b and the conformal material 57 in the conductive line opening provide an etch mask. which is self aligned with the conductive line pattern shown in FIGS. 4i and 4j, for etching a via opening 58. In etching the via opening 58 in the lower half 52b of the SiO₂ insulating layer as shown in FIGS. 4i and 4j, the etchant is the same one that was used for etching the conductive line opening in the upper half 52a of the insulating layer. Once the via opening 58 is formed. additional metal is added to already present metal in the conductive lines and herein Al/1%Cu is sputtered deposited on the already present metal in the conductive line opening 57. During deposition. the metal fills the via opening 58 (FIG. 4j) with a plug 60 (FIG. 4l) to make physical contact and electrical connection with the conductive line 51 in the underlying insulating layer (not shown). After the additional metal is deposited, the surfaces of the barrier layer 53 and metal 57 are planarized using commercially available chem/mech polishing equipment and slurry.

According to another aspect of the present invention as shown in FIG. 4k, a metal 61 different from the conformal material 57 and plug 60 is deposited in the via opening 58 because it possesses superior electromigration properties compared to the conformal metal material 57. Preferably, the different metal 61 is tungsten (W) which is CVD deposited using commercial equipment.

Although the preferred method of forming the self aligned via does not remove the barrier layer 53, it can be removed prior to the deposition of the additional metal for the conductive lines and filling the via openings as shown in FIGS. 4m, 4n, 4o and 4p. The barrier layer 53, which herein is TiN, is sputter etched as previously described in etching the conductive line and via pattern of FIG. 4e, with the SiO₂ serving as an etch stop as shown in FIGS. 4m and 4n. In FIG. 4p, the metal used to fill the plug 60 is the same as conformal material whereas, in FIG. 4o, a different metal 61 such as W is used. These metals are deposited in the same manner as previously described above. Again, the surfaces of the insulating layer portion 52a and metal 57 are planarized using commercially available chem/mech polishing equipment and slurry.

Figure 5G:
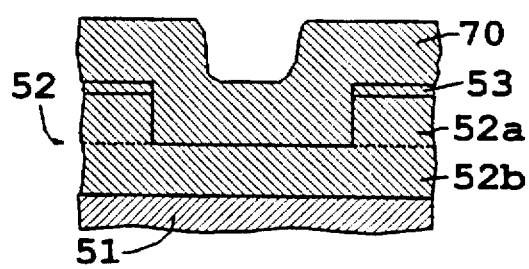
FIGS. 5g and 5h are cross-sectional views of a modification of the steps of FIGS. 4g and 4h to show another embodiment of the present invention.
Figure 5H:
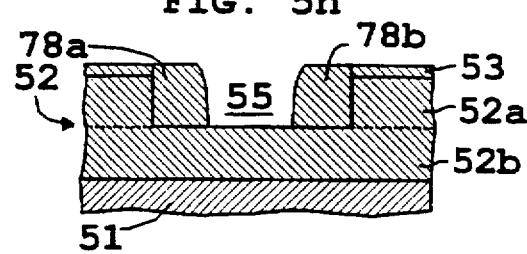
Figure 5I:
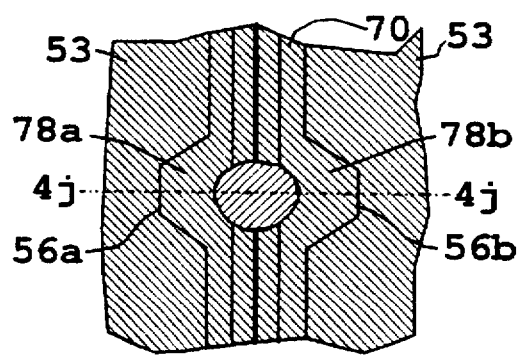
FIG. 5i is a plan view of one of the sequential steps of the other embodiment of the present invention.
Figure 5J:
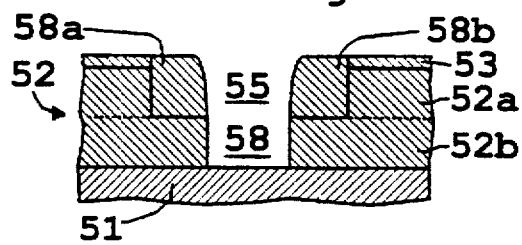
FIG. 5j is a cross-sectional view of the insulating layer of taken across 5j—5j of FIG. 5i.
Figure 5Q:
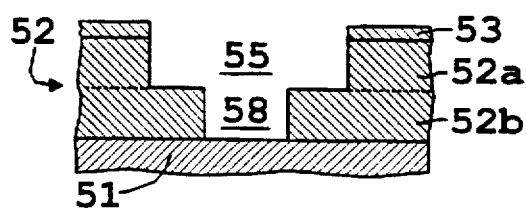
FIGS. 5q and 5r are cross-sectional views of the remaining sequential steps of the other embodiment of the present invention.
Figure 5R:
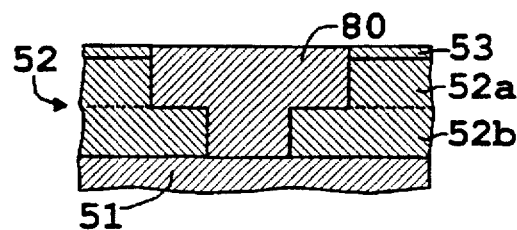

In another embodiment of the present invention as shown with reference to FIGS. 5g, 5h, 5i, 5j, 5q and 5r, the conformal material is a conformal insulating material 70 instead of a metal. The description of the process up to FIG. 4f is the same. Once the conductive line opening 55 is formed, an insulating material 70 having etch selectivity different from the insulating material, herein SiO₂, such as polysilcon is deposited in the conductive line opening 55 and the enlarged openings 56a and 56b as shown in FIG. 5g. After deposition, the conformal insulating material 70 is etched using herein sulfur hexafluoride (SF₆) and chlorine (Cl₂) in the same reactive ion etcher as was used for etching the metal 57 to create sidewalls 78a and 78b. Using these sidewalls as an etch mask. the lower portion 52b of the insulating layer is etched using the same etchant gases and parallel plate reactor described with the metal sidewalls 58a and 58b of FIGS. 4i and 4j to create the via opening 58. Now, since the polysilicon is not conductive in the same manner as an Al alloy. the polysilicon must be removed from the conductive line opening 55 and will be removed from the enlarged opening 56a and 56b at the same time. This is accomplished with the same etchant gases of SF₆ and Cl₂ and reactor that was used to form the sidewalls. Once removed, the conductive line openings 55, the enlarged openings 56a, 56b and the via opening 58 are filled with metal, preferably Al/1%Cu by sputtering. Again, the surface is planarized by preferably chem/mech polishing. The single pattern, self aligned via dual damascene method of the present invention yields a novel interconnection structure comprising an insulating layer 52 having an upper 52a and a lower portion 52b of FIG. 4a or different upper and lower layers 52a" and 52b", respectively, of FIG. 4a". A conductive line 57 is disposed in the upper layer portion 52a and a via plug of the same conductive material 60 or a different conductive material 61 is disposed in the lower portion or layer. The conductive line comprises a section having a pair of substantially parallel walls ending at an enlarged regions 56a and 56b with each wall extending laterally. The combined width of the lateral extending walls is preferably about equal to the thickness of the conductive line. The width of the laterially extending walls can be determined by the formula $$W = \frac{b-y}{2}$$

In one embodiment, the enlarged regions 56a, 56b of the upper portion 52a of the insulating layer contain sidewalls 58a, 58b of a conductive material 57 such as aluminum or an aluminum alloy and. in another embodiment, these regions contain other than a conductive material, such as polysilicon.

Although this invention has been described relative to specific insulating materials, conductive materials and apparatuses for depositing and etching these materials, it is not limited to such materials and other materials and apparatuses for depositing and etching insulating and conductive materials can be substituted as is well understood by those skilled in the microelectronics arts. Further, although the embodiments of the present invention is directed to dual damascene on semiconductor devices, it also will be recognized by those skilled in the multilevel substrate arts that the present invention can be used in fabricating a multilevel substrate to interconnect one or more semiconductor devices (chips) in a higher level electronic circuit system. Such multilevel substrates use organic insulating layers, such as polyimide, and conductive lines, such as copper. The self-aligned dual damascene of the present invention is well suited for the manufacture of such multilevel insulating and conductive layers with connecting conductive vias.

We claim:

1. A method of fabricating interconnecting conductive lines and conductive vias in a layer of insulating material comprising the steps of:

creating a pattern for a conductive line opening having enlarged regions at sections in the line opening to be via openings and about half of the width of the width of the conductive line;

etching said pattern partially through the insulating layer so that a conductive line opening is formed in the upper half of the layer;

depositing a material having etch selectivity different from the material of the insulating layer;

etching said deposited material to form sidewalls in the enlarged regions and to expose the insulating layer between the sidewalls;

etching said exposed insulating layer between the sidewalls with the sidewalls and the deposited material at each end of the sidewalls serving as an etch mask so that a via opening is formed in the lower half of the insulating layer; and filling said conductive line opening and via opening with conductive material.

2. The method of claim 1 wherein said insulating layer is two layers, one for the via and the other for the conductive line.

3. The method of claim 2 wherein said two layers of insulating material are separated by a thin etch stop.

4. The method of claim 2 wherein said two layers of insulating material are of different materials with different etch selectivity to the same etchant, with the lower of the two layer serving as an etch stop.

5. The method of claim 1 wherein said deposited material is a nonmetal and is removed after the via opening is formed.

6. In the method of fabricating a multilevel interconnection structure with at least one level of interconnection, said level of interconnection having at least one conductive line and at least one conductive via with the via in contact with the conductive line comprising:

providing an insulating material of essentially the thickness of an interconnection level and having an upper layer and a lower layer;

forming an opening in said upper layer for a conductive line having substantially parallel sides and with at least one enlarged region laterally extending from at least one side of the conductive line opening;

depositing in said opening a conformal material having an removal selectivity different from the removal selectivity of said insulating material;

removing said deposited material to form a sidewall of the deposited material in said laterally extending region and an opening in the deposited material adjacent to said sidewall;

using said sidewall as a mask to remove the insulating material in said lower layer and form a via opening; and filling said conductive line opening and via opening with conductive material.

7. The method of claim 6 wherein said enlarged region laterally extends from both sides of the conductive line opening.

8. The method of claim 6 wherein said insulating material of said upper layer is different from insulating material of said lower layer and each insulating material having a different removal selectivity from the other.

9. The method of claim 6 wherein said insulating material in the upper layer and lower layer are the same and are separated by a thin barrier layer having a removal selectivity different from the insulating material.

10. The method of claim 6 wherein the removal of the conformal deposited material is by anisotropic etching.

11. The method of claim 6 wherein the conformal deposited material is a metal.

12. The method of claim 6 wherein the conformal deposited material is a non-metal and is removed after forming said via opening.

13. The method of claim 6 wherein said conductive material filling the line opening and the via opening is the same material.

14. The method of claim 6 wherein said conductive material filling the via opening is different from the conductive material filling the conductive line opening.

15. A method of fabricating interconnecting conductive lines and conductive vias in a layer of insulating material comprising the steps of:

creating a pattern for a conductive line opening having enlarged regions at sections in the line opening to be via openings and about half of the width of the width of the conductive line;

etching said pattern partially through the insulating layer so that a conductive line opening is formed in the upper half of the layer;

depositing a conformal conductive metal having etch selectivity different from the material of the insulating layer, said metal becoming part of the conductive line;

etching said deposited material to form sidewalls in the enlarged regions and to expose the insulating layer between the sidewalls;

etching said exposed insulating layer between the sidewalls with the sidewalls and the deposited material at each end of the sidewalls serving as an etch mask so that a via opening is formed in the lower half of the insulating layer; and filling said conductive line opening and via opening with conductive material.

16. The method of claim 15 wherein said conformal metal is either aluminum or an alloy of aluminum.

17. The method of claim 15 wherein said conductive material for filling said conductive line opening and via opening is a metal different from said conformal deposited metal.

18. The method of claim 17 wherein said conformal deposited metal is either aluminum or an alloy of aluminum and said conductive material is tungsten surrounded by the conformal deposited metal at the via.

19. A method of fabricating interconnecting conductive lines and conductive vias in a layer of insulating material comprising the steps of:

creating a pattern for a conductive line opening having enlarged regions at sections in the line opening to be via openings and about half of the width of the width of the conductive line, said width of each enlarged region of the conductive line opening being determined by the following equation:

$$W = \frac{b-y}{2}$$

where W is the width of the enlarged region from one side of the conductive line, b is the width of the conductive line and the enlarged regions on both sides of the conductive line and the enlarged regions on both sides of the conductive line, and y is the width of the via;

etching said pattern partially through the insulating layer so that a conductive line opening is formed in the upper half of the layer;

depositing a material having etch selectivity different from the material of the insulating layer;

etching said deposited material to form sidewalls in the enlarged regions and to expose the insulating layer between the sidewalls;

etching said exposed insulating layer between the sidewalls with the sidewalls and the deposited material at each end of the sidewalls serving as an etch mask so that a via opening is formed in the lower half of the insulating layer; and filling said conductive line opening and via opening with conductive material.

20. In the method of fabricating a multilevel interconnection structure with at least one level of interconnection, said level of interconnection having at least one conductive via with the via in contact with the conductive line comprising:

providing an insulating material of essentially the thickness of an interconnection level and having an upper layer and a lower layer;

forming an opening in said upper layer for a conductive line having substantially parallel sides and with at least one enlarged region laterally extending from at least one side of the conductive line opening and having a width, said width of each enlarged region of the conductive line opening being determined by the following equation:

$$W \approx \frac{b-y}{2}$$

where W is the width of the enlarged region from one side of the conductive line, b is the width of the conductive line and the enlarged regions on both sides of the conductive line and the enlarged regions on both sides of the conductive line, and y is the width of the via;

depositing in said opening a conformal material having a removal selectivity different from the removal selectivity of said insulating material;

removing said deposited material to form a sidewall of the deposited material in said laterally extending region and an opening in the deposited material adjacent to said sidewall;

using said sidewall as a mask to remove the insulating material in said lower layer and form a via opening; and filling said conductive line opening and via opening with conductive material.

* * * * *